(12) United States Patent
Hu

(10) Patent No.: US 12,324,240 B2
(45) Date of Patent: Jun. 3, 2025

(54) ARRAY SUBSTRATE INCLUDING PEELING PREVENTION AND ANTI-REFLECTIVE FUNCTIONAL LAYERS

(71) Applicant: TCL CHINA STAR OPTOELECTRONICS TECHNOLOGY CO., LTD., Guangdong (CN)

(72) Inventor: Xiaobo Hu, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 543 days.

(21) Appl. No.: 17/426,749

(22) PCT Filed: Jun. 15, 2021

(86) PCT No.: PCT/CN2021/099933
§ 371 (c)(1),
(2) Date: Jul. 29, 2021

(87) PCT Pub. No.: WO2022/160561
PCT Pub. Date: Aug. 4, 2022

(65) Prior Publication Data
US 2022/0392927 A1 Dec. 8, 2022

(30) Foreign Application Priority Data
Jan. 28, 2021 (CN) .................. 202110115229.X

(51) Int. Cl.
*H10D 86/60* (2025.01)
*G02B 1/11* (2015.01)
(Continued)

(52) U.S. Cl.
CPC .............. *H10D 86/60* (2025.01); *G02B 1/11* (2013.01); *H10D 86/0221* (2025.01); *H10D 86/443* (2025.01)

(58) Field of Classification Search
CPC ............. H01L 27/1244; H01L 27/1214; H01L 29/78633; H01L 29/78669;
(Continued)

(56) References Cited

U.S. PATENT DOCUMENTS

| 10,727,273 B2 * | 7/2020 | Joseph ................. H10N 50/01 |
| 2001/0046784 A1 * | 11/2001 | Broekaart ........... H01L 23/5329 438/483 |

(Continued)

FOREIGN PATENT DOCUMENTS

| CN | 102227761 A | 10/2011 |
| CN | 105717718 A | 6/2016 |

(Continued)

*Primary Examiner* — Ida M Soward
(74) *Attorney, Agent, or Firm* — Rivka Friedman

(57) ABSTRACT

An array substrate includes a substrate; a thin film transistor layer including a gate electrode, a source electrode, and a drain electrode; and a first anti-reflective layer disposed between the substrate and the thin film transistor layer and disposed corresponding to at least one of the gate electrode, the source electrode, or the drain electrode. The first anti-reflective layer includes a peeling prevention layer and an anti-reflective functional layer. The anti-reflective functional layer is disposed on a side of the peeling prevention layer away from the substrate.

20 Claims, 9 Drawing Sheets

(51) Int. Cl.
*H10D 86/01* (2025.01)
*H10D 86/40* (2025.01)

(58) Field of Classification Search
CPC ..... H01L 29/78678; G02B 1/11; G02B 1/113;
G02B 1/10; G02F 1/1362; H10D 86/60;
H10D 86/443; H10D 86/6723; H10D
86/40; H10K 59/12
See application file for complete search history.

(56) References Cited

U.S. PATENT DOCUMENTS

| | | | |
|---|---|---|---|
| 2003/0073267 A1* | 4/2003 | Baek ................. | H01L 27/124 |
| | | | 257/E29.147 |
| 2013/0240995 A1* | 9/2013 | Li ..................... | H10D 30/6743 |
| | | | 257/E27.06 |
| 2015/0091004 A1* | 4/2015 | Kim ................... | H01L 27/124 |
| | | | 257/43 |
| 2016/0133198 A1* | 5/2016 | Jeong ................. | G09G 3/36 |
| | | | 345/212 |
| 2020/0119093 A1* | 4/2020 | Joseph ............... | H10N 50/85 |
| 2021/0208731 A1* | 7/2021 | Hu .................... | G02F 1/13338 |
| 2022/0352381 A1* | 11/2022 | Liu ................... | G02F 1/1368 |

FOREIGN PATENT DOCUMENTS

| | | | | |
|---|---|---|---|---|
| CN | 110767660 A | | 2/2020 | |
| CN | 112909022 A | | 6/2021 | |
| JP | 2005302808 A | * | 10/2005 | ........... H01L 29/789 |
| KR | 20140107091 A | * | 9/2014 | ....... G02F 1/133502 |

\* cited by examiner

ARRAY SUBSTRATE INCLUDING PEELING PREVENTION AND ANTI-REFLECTIVE FUNCTIONAL LAYERS

BACKGROUND OF INVENTION

Field of Invention

The present disclosure relates to the field of display technology, and particularly to an array substrate and a manufacturing method thereof, and a display device.

Description of Prior Art

With development of display technology, bezels of display devices gradually become narrower or even bezel-free. A substrate side of an array substrate of a known display device without a bezel acts as a viewing side. A flexible circuit board is bound to a non-display region on a side of the array substrate opposite to the viewing side, and the flexible circuit board is electrically connected to a printed circuit board. In this structure, the flexible circuit board is bent to the side of the array substrate opposite to the viewing side, wherein extent of bending is little. While reliability of display modules is improved, the display device without the bezel can be realized.

However, when the substrate side of the array substrate is used as the viewing side, because a metal layer in a thin film transistor on the array substrate is not shielded by a light shielding layer, reflectivity of the display device to ambient light is significantly increased. In order to solve a light reflection problem of the display device, an anti-reflective layer is generally disposed between the thin film transistor and the substrate to reduce reflection of the ambient light. However, separation between the anti-reflective layer and the substrate is prone to occur, which increases the reflectivity and can cause an increase in peeling risk of film layers of the thin film transistor, thereby causing display effect to be poor.

SUMMARY OF INVENTION

On the basis of this, a purpose of the present application is to provide an array substrate and a manufacturing method thereof, and a display device, which can prevent separation from occurring between the anti-reflective layer and the substrate.

The present application provides an array substrate, including:

a substrate, wherein the substrate includes a first surface and a second surface disposed opposite to each other;

a thin film transistor layer disposed on the first surface, wherein the thin film transistor layer includes a gate electrode, a source electrode, and a drain electrode, the gate electrode is disposed on the first surface, and the source electrode and the drain electrode are located on a side of the gate electrode away from the substrate; and a first anti-reflective layer disposed between the substrate and the thin film transistor layer and disposed corresponding to at least one of the gate electrode, the source electrode, or the drain electrode, wherein, the first anti-reflective layer includes a peeling prevention layer and an anti-reflective functional layer, the peeling prevention layer is disposed on the first surface, and the anti-reflective functional layer is disposed on a side of the peeling prevention layer away from the substrate.

In one embodiment, a material of the anti-reflective functional layer includes molybdenum oxide, and a material of the peeling prevention layer includes aluminum oxide.

In one embodiment, the molybdenum oxide includes MoOx-a and/or MoOx, and wherein x is 2 or 3, a is 0 or 1.

In one embodiment, the thin film transistor layer further includes an active layer, the active layer is located on a side of the gate electrode away from the substrate, the source electrode and the drain electrode are located on a side of the active layer away from the gate electrode, the first anti-reflective layer includes a first portion, the first portion is disposed corresponding to the gate electrode, and the first portion is disposed on a side of the gate electrode close to the substrate.

In one embodiment, the first anti-reflective layer further includes a second portion and a third portion located on two sides of the first portion, the second portion is disposed corresponding to the source electrode, and the third portion is disposed corresponding to the drain electrode.

In one embodiment, the thin film transistor layer further includes an active layer, the active layer is located on a side of the gate electrode close to the substrate, the first anti-reflective layer includes a first portion, and a second portion and a third portion located on two sides of the first portion, the first portion is disposed corresponding to the gate electrode, and the second portion is disposed corresponding to the source electrode, and the third portion is disposed corresponding to the drain electrode.

In one embodiment, the thin film transistor layer further includes an active layer, the active layer is located on a side of the gate electrode close to the substrate, the first anti-reflective layer includes a fourth portion and a fifth portion, the fourth portion is disposed corresponding to the source electrode, the fifth portion is disposed corresponding to the drain electrode, and the array substrate further includes a second anti-reflective layer, and the second anti-reflective layer is disposed corresponding to the gate electrode and is disposed on a side of the gate electrode facing toward the substrate.

In one embodiment, a transmittance of the peeling prevention layer is greater than or equal to 90%, and the peeling prevention layer covers the first surface.

In one embodiment, a refractive index of the substrate is less than a refractive index of the peeling prevention layer, and the refractive index of the peeling prevention layer is less than a refractive index of the anti-reflective functional layer.

The present application further provides a manufacturing method of an array substrate, including following steps:

providing a substrate, wherein the substrate comprises a first surface and a second surface disposed opposite to each other;

forming a first anti-reflective layer on the first surface, wherein, the anti-reflective layer includes a peeling prevention layer and an anti-reflective functional layer, the peeling prevention layer is disposed on the first surface, and the anti-reflective functional layer is disposed on a surface of the peeling prevention layer away from the substrate; and forming a thin film transistor layer on a surface of the anti-reflective layer away from the substrate, and wherein, the thin film transistor layer includes a source electrode, a drain electrode, and a gate electrode, the gate electrode is disposed on a side of the anti-reflective layer away from the substrate, the source electrode and the drain electrode are located on a side of the gate electrode away from the substrate; and at least one of the gate electrode, the source electrode, or the drain electrode is disposed corresponding to the anti-reflective layer.

In one embodiment, forming the first anti-reflective layer on the first surface includes:

forming a first material layer on the first surface, wherein a material of the first material layer is aluminum;

forming a second material layer on a surface of the first material layer away from the substrate, wherein a material of the second material layer includes MoOx, and wherein x is 2 or 3; and making reaction occur in the first material layer and the second material layer, wherein the aluminum in the first material layer captures oxide in the second material layer to form a peeling prevention layer, a material of the peeling prevention layer includes aluminum oxide, the second material layer forms an anti-reflective functional layer, a material of the anti-reflective functional layer includes MoOx-a, and wherein x is 2 or 3, a is 0 or 1, and the peeling prevention layer and the anti-reflective functional layer form the first anti-reflective layer.

In one embodiment, making the reaction occur in the first material layer and the second material layer includes:

performing a high-temperature process on the substrate formed with the first material layer and the second material layer under vacuum to make the reaction occur in the first material layer and the second material layer.

The present application further provides a display device, including:

an array substrate, including:

a substrate, wherein the substrate includes a first surface and a second surface disposed opposite to each other;

a thin film transistor layer disposed on the first surface, wherein the thin film transistor layer includes a gate electrode, a source electrode, and a drain electrode, the gate electrode is disposed on the first surface, and the source electrode and the drain electrode are located on a side of the gate electrode away from the substrate; and a first anti-reflective layer disposed between the substrate and the thin film transistor layer and disposed corresponding to at least one of the gate electrode, the source electrode, or the drain electrode, wherein, the first anti-reflective layer includes a peeling prevention layer and an anti-reflective functional layer, the peeling prevention layer is disposed on the first surface, and the anti-reflective functional layer is disposed on a side of the peeling prevention layer away from the substrate;

a color film substrate disposed opposite to the array substrate;

a driving component disposed on a side of the color film substrate facing toward the color film substrate; and a flexible connection component electrically connected to the array substrate and the driving component.

In one embodiment, a material of the anti-reflective functional layer includes molybdenum oxide, and a material of the peeling prevention layer includes aluminum oxide.

In one embodiment, the molybdenum oxide includes MoOx-a and/or MoOx, and wherein x is 2 or 3, a is 0 or 1.

In one embodiment, the thin film transistor layer further includes an active layer, the active layer is located on a side of the gate electrode away from the substrate, the source electrode and the drain electrode are located on a side of the active layer away from the gate electrode, the first anti-reflective layer includes a first portion, the first portion is disposed corresponding to the gate electrode, and the first portion is disposed on a side of the gate electrode close to the substrate.

In one embodiment, the first anti-reflective layer further includes a second portion and a third portion located on two sides of the first portion, the second portion is disposed corresponding to the source electrode, and the third portion is disposed corresponding to the drain electrode.

In one embodiment, the thin film transistor layer further includes an active layer, the active layer is located on a side of the gate electrode close to the substrate, the first anti-reflective layer includes a first portion, and a second portion and a third portion located on two sides of the first portion, the first portion is disposed corresponding to the gate electrode, and the second portion is disposed corresponding to the source electrode, and the third portion is disposed corresponding to the drain electrode.

In one embodiment, the thin film transistor layer further includes an active layer, the active layer is located on a side of the gate electrode close to the substrate, the first anti-reflective layer includes a fourth portion and a fifth portion, the fourth portion is disposed corresponding to the source electrode, the fifth portion is disposed corresponding to the drain electrode, and the array substrate further includes a second anti-reflective layer, and the second anti-reflective layer is disposed corresponding to the gate electrode and is disposed on a side of the gate electrode facing toward the substrate.

In one embodiment, a transmittance of the peeling prevention layer is greater than or equal to 90%, and the peeling prevention layer covers the first surface. By disposing the peeling prevention layer between the anti-reflective functional layer and the substrate of the array substrate, peeling between the thin film transistor and the substrate can be prevented.

The display device provided by the present application includes the aforesaid array substrate. By disposing the peeling prevention layer between the anti-reflective functional layer and the substrate of the array substrate, peeling between the thin film transistor and the substrate can be prevented, thereby reducing the reflectivity and improving display effect.

In the manufacturing method of the array substrate of the present application, by forming the peeling prevention layer between the anti-reflective functional layer and the substrate of the array substrate, peeling between the thin film transistor and the substrate in the array substrate can be prevented, thereby reducing the reflectivity and improving display effect.

DESCRIPTION OF DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

The technical solutions in the embodiments of the present application are clearly and completely described in the following with reference to the accompanying drawings in the embodiments of the present application. Obviously, the described embodiments are only part of the embodiments of the present disclosure, but are not all embodiments of the present disclosure. All other embodiments obtained by those skilled in the art based on the embodiments of the present disclosure without creative efforts are within the scope of the present disclosure.

Figure 1:
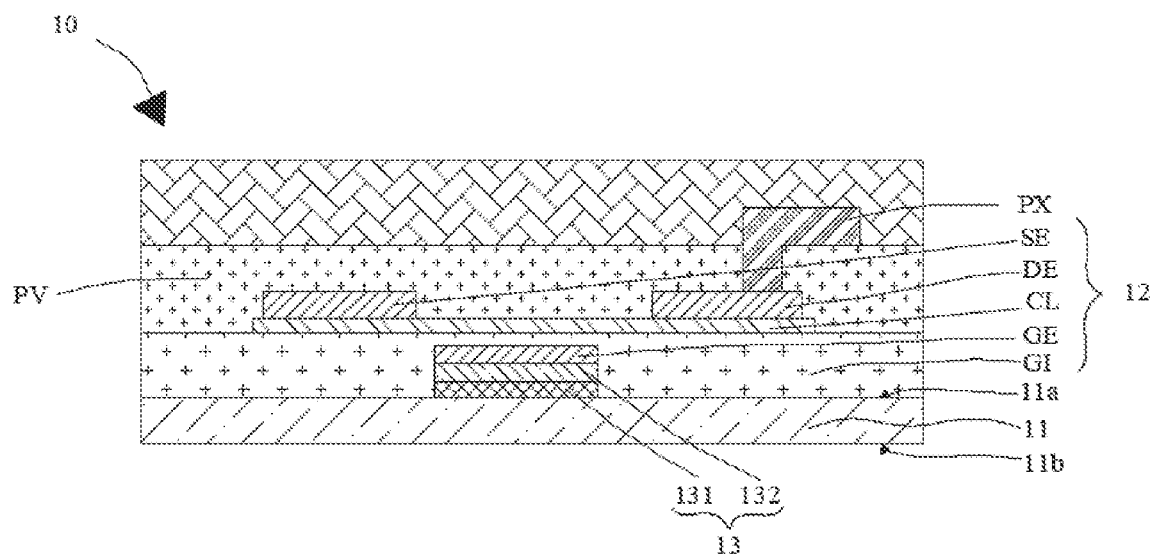
FIG. 1 is a schematic diagram of one structure of an array substrate provided by the present application.

Please refer to FIG. 1, the present application provides an array substrate 10. The array substrate 10 includes a substrate 11, a thin film transistor 12, and a first anti-reflective layer 13. The array substrate 10 can further include a passivation layer PV covering the thin film transistor layer 12 and a pixel electrode PX disposed on the passivation layer. The pixel electrode PX is electrically connected to the thin film transistor layer 12 through a via hole defined in the passivation layer PV.

The substrate 11 can be a glass substrate or a plastic substrate, etc. In one embodiment, the substrate 11 is the glass substrate. In another embodiment, the substrate 11 is a flexible substrate. The flexible substrate can be composed of a single flexible organic layer, or can be composed of two or more flexible organic layers. The substrate 11 includes a first surface 11a and a second surface 11b disposed opposite to each other.

It should be noted that the first surface 11a can be an upper surface of the substrate 11, and the second surface 11b can be a lower surface of the substrate 11. Of course, the first surface 11a can also be the lower surface of the substrate 11, and the second surface 11b can be the upper surface of the substrate 11. In this application, without specific instructions, as default, the first surface 11a is the lower surface of the substrate 11, and the second surface 11b is the upper surface of the substrate 11.

The thin film transistor layer 12 is disposed on the first surface 11a of the substrate 11. The thin film transistor layer 12 includes an active layer CL, a source electrode SE, a drain electrode DE, and a gate electrode GE. The gate electrode GE is located between the active layer CL and the substrate 11, or the gate electrode GE is located on a side of the active layer CL away from the substrate 11. The source electrode SE and the drain electrode DE are located on a side of the gate electrode GE away from the substrate 11. It should be noted that disposing on the first surface 11a of the substrate 11 can mean directly contacting to the first surface 11a, or indirectly contacting to the first surface 11a.

In this embodiment, the thin film transistor layer 12 is a bottom-gate type thin film transistor. The thin film transistor layer 12 includes the gate electrode GE, the gate insulation layer GI, the active layer CL, the source electrode SE, and the drain electrode DE stacked in sequence. Specifically, the first anti-reflective layer 13 is disposed on the first surface 11a. The gate electrode GE is disposed on a side of the first anti-reflective layer 13 away from the first surface 11a. The gate electrode GE is disposed on the first surface 11a of the substrate 11, and the gate insulation layer GI covers the gate electrode GE. The active layer CL is located on a side of the gate insulation layer GI away from the substrate 11. The active layer CL is disposed corresponding to the gate electrode GE. The source electrode SE and the drain electrode DE are located on a side of the active layer CL away from the gate electrode GE and are respectively connected to two ends of the active layer CL.

Materials of the gate electrode GE, the source electrode SE, and the drain electrode DE can be a single-layer metal of copper (Cu), tantalum (Ta), tungsten (W), molybdenum (Mo), aluminum (Al), titanium (Ti) etc., or can be multi-layer metals. For example, a double-layer metal of molybdenum/tantalum (Mo/Ta), a double-layer metal of molybdenum/tungsten (Mo/W), a three-layer metal of molybdenum (Mo)/aluminum (Al)/molybdenum (Mo), etc., can be used.

A material of the active layer CL can be monocrystalline silicon, low-temperature polycrystalline-silicon, or oxide semiconductor materials. The oxide semiconductor materials can include indium gallium zinc oxide (IGZO), indium gallium zinc tin oxide (IGZTO), indium zinc oxide (IZO), indium gallium oxide (IGO), indium gallium tin oxide (IGTO), indium zinc tin oxide (IZTO), and indium tin oxide (ITO), etc.

A material of the gate insulation layer GI can be one selected from the group consisting of silicon dioxide, nitrogen dioxide, and a laminated layer thereof.

The first anti-reflective layer 13 is disposed between the substrate 11 and the thin film transistor layer 12. The first anti-reflective layer 13 can be disposed corresponding to at least one of the gate electrode GE, the source electrode SE, or the drain electrode DE. The first anti-reflective layer 13 includes a peeling prevention layer 131 and an anti-reflective functional layer 132. The peeling prevention layer 131 is disposed on the first surface 11a. It should be noted that disposing on the first surface 11a of the substrate 11 can mean directly contacting to the first surface 11a, or indirectly contacting to the first surface 11a. In this embodiment, the peeling prevention layer 131 is directly contacted to the substrate 11.

The anti-reflective functional layer 132 is disposed on a side of the peeling prevention layer 131 away from the substrate 11. The anti-reflective functional layer 132 is configured to reduce reflection of ambient light of at least one of the gate electrode GE, the source electrode SE, or the drain electrode DE of the thin film transistor layer 12. The peeling prevention layer 131 is located between the anti-reflective functional layer 132 and the substrate 11 to prevent peeling between the anti-reflective functional layer 132 and the substrate 11.

A material of the anti-reflective functional layer 132 includes molybdenum oxide. Specifically, a material of the anti-reflective functional layer 132 can be molybdenum oxide or an alloy of molybdenum oxide. The molybdenum oxide alloy is to add other metal elements, such as Ti, Ta, W, etc., in the molybdenum oxide.

In one embodiment, the molybdenum oxide includes $MoO_x$ and/or $MoO_{x-a}$, wherein x can be 2 or 3, and a can be 0 or 1. In other words, the molybdenum oxide can include one or two of molybdenum monoxide, molybdenum dioxide, or molybdenum trioxide.

A material of the peeling prevention layer 131 includes aluminium oxide ($Al_2O_3$). Compared to a single layer of the molybdenum oxide, aluminum oxide-molybdenum oxide composite film layers can improve adhesion of the first anti-reflective layer 13 to the substrate 11. In addition, an Al—Mo metal bond can also be formed between the anti-reflective functional layer 132 and the peeling prevention layer 131. Existence of the Al—Mo metal bond can further increase bonding force between the aluminum oxide-molybdenum oxide composite film layers.

In one embodiment, a thickness of the peeling prevention layer 131 ranges from 10 angstroms to 100 angstroms. Specifically, a thickness of the peeling prevention layer 131 can be 10 angstroms, 20 angstroms, 30 angstroms, 40 angstroms, 50 angstroms, 60 angstroms, 70 angstroms, 80 angstroms, 90 angstroms, or 100 angstroms. In this embodiment, a thickness of the material of the peeling prevention layer 131 is relatively thin. The thin aluminum film can be etched by fluorine-containing hydrogen peroxide copper acid in subsequent manufacturing processes, thereby reducing difficulty the processes.

In one specific embodiment, the molybdenum oxide includes molybdenum dioxide. The first anti-reflective layer 13 is formed by directly depositing a material of the molybdenum dioxide on the aluminium oxide. In one specific embodiment, the molybdenum oxide includes molybdenum trioxide. The first anti-reflective layer 13 is formed by directly depositing a material of the molybdenum trioxide on the aluminium oxide. In another specific embodiment, molybdenum dioxide is deposited on the aluminum film, and aluminum atoms in the aluminum film are combined with the oxygen in the molybdenum dioxide to form aluminum oxide, which is the peeling prevention layer 131, and then the molybdenum dioxide becomes molybdenum monoxide, which is the anti-reflective functional layer 132. Therefore, the first anti-reflective layer 13 is obtained. According to a progress of the reaction, there is molybdenum dioxide that did not participate in the reaction in the anti-reflective functional layer 132. At this time, the anti-reflective functional layer 132 includes molybdenum monoxide and molybdenum dioxide. In another specific embodiment, molybdenum trioxide is deposited on the aluminum film, and aluminum atoms in the aluminum film are combined with the oxygen in the molybdenum dioxide to form aluminum oxide, which is the peeling prevention layer 131, and then the molybdenum trioxide becomes molybdenum monoxide and/or molybdenum dioxide, which is the anti-reflective functional layer 132. Therefore, the first anti-reflective layer 13 is obtained. According to a progress of the reaction, there is molybdenum trioxide that did not participate in the reaction in the anti-reflective functional layer 132. At this time, the anti-reflective functional layer 132 includes molybdenum monoxide, molybdenum dioxide, and molybdenum trioxide. It can be understood that in another specific embodiment, the molybdenum dioxide and molybdenum trioxide can also be deposited on the aluminum film, and aluminum atoms in the aluminum film combine with the oxygen in the molybdenum dioxide to form aluminum oxide, which is the peeling prevention layer 131, and then the molybdenum dioxide and the molybdenum trioxide becomes molybdenum monoxide and the molybdenum dioxide, which are the anti-reflective functional layer 132. Therefore, the first anti-reflective layer 13 is obtained.

In one embodiment, a refractive index of the substrate 11 is less than a refractive index of the peeling prevention layer 131, and the refractive index of the peeling prevention layer 131 is less than a refractive index of the anti-reflective functional layer 132. When light enters another medium with a refractive index of n1 from a medium with a refractive index of n0, light reflection occurs at an interface between the two media. When the reflectivity of the two media satisfies n0<n1, destructive interference occurs on reflected light, reducing reflectivity. By setting the refractive index of the substrate 11 to be smaller than the refractive index of the peeling prevention layer 131, and by setting the refractive index of the peeling prevention layer 131 to be smaller than the refractive index of the anti-reflective functional layer 132, a refractive index of the array substrate 10 to ambient light can be further reduced, and the display effect can be improved.

In one embodiment, the glass substrate is used as the substrate 11. The refractive index of the substrate 11, the refractive index of the peeling prevention layer 131, and the refractive index of the anti-reflective functional layer 132 are sequentially 1.50, 1.65, and 2.20. Light is incident from the glass substrate. During a propagation of the light in the substrate 11, the peeling prevention layer 131, and the anti-reflective functional layer 132, many interference effects are generated, which further reduce the reflectivity.

Under a condition that Cu is used as a material of the gate electrode GE, and the film thicknesses of the glass substrate, the anti-reflective functional layer 132, and the gate electrode GE are unchanged, through experiments for testing the reflectivities of the composite films, the reflectivity of the aluminum-oxide molybdenum-oxide copper composite film is 4.5%, and the reflectivity of the molybdenum-oxide copper composite film is 5.8%. Experimental data confirms that the composite film with $Al_2O_3$ has lower reflectivity and better display effect.

In this embodiment, the first anti-reflective layer 13 is disposed corresponding to the gate electrode GE. Specifically, the gate electrode GE is disposed on a side of the first anti-reflective layer 13 away from the substrate 11.

In one embodiment, the first anti-reflective layer 13 has a shape same as the gate electrode GE. An orthogonal projection of the first anti-reflective layer 13 on the substrate 11 overlaps an orthogonal projection of the gate electrode GE on the substrate 11. The first anti-reflective layer 13 and the gate electrode GE can be patterned in one same process, thereby simplifying processes.

In the present application, the structure of the thin film transistor layer 12 is not limited. The thin film transistor layer 12 can be a top-gate type thin film transistor, can also be a bottom-gate type thin film transistor, or can also be a double-gate type thin film transistor. A position and a structure of the first anti-reflective layer can be configured according to the structure of the thin film transistor layer 12. In the following, other structures of the array substrate 10 provided in the present application are further described. It can be understood that the following examples are only exemplary description for the technical ideas of the present application, and should not be regarded as limiting the present application.

Figure 2:
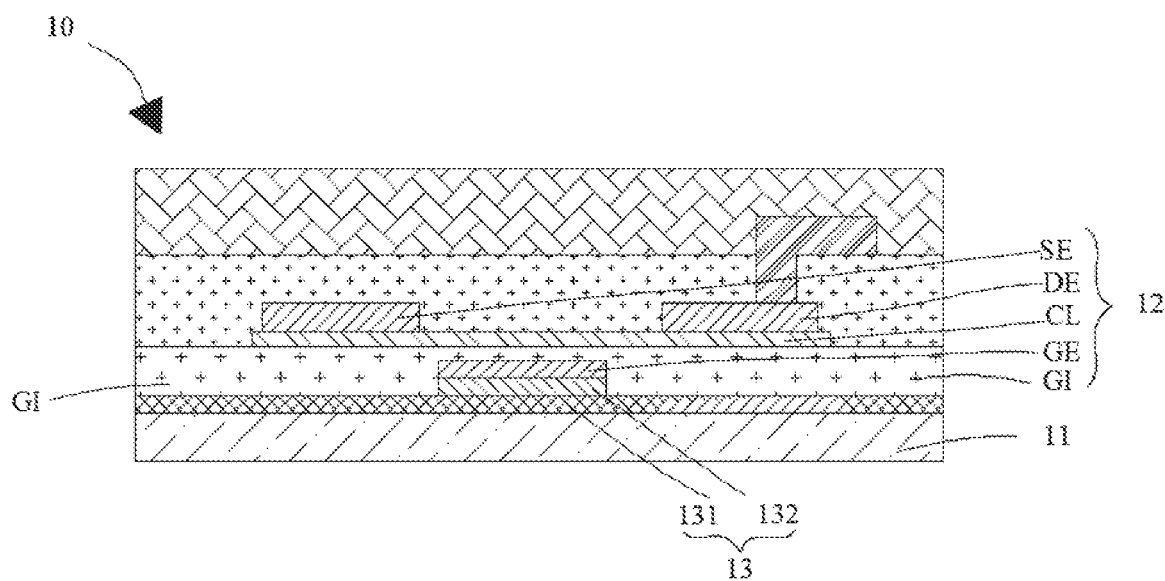
FIG. 2 is a schematic diagram of another structure of the array substrate provided by the present application.

Please refer to FIG. 2. FIG. 2 is a schematic diagram of another structure of the array substrate 10 provided by the present application.

The difference between the array substrate 10 of this embodiment and the array substrate 10 in FIG. 1 is that:

the anti-reflective functional layer 132 in the first anti-reflective layer 13 has a shape same as the gate electrode GE; the peeling prevention layer 131 covers the first surface 11a; Al$_2$O$_3$ in the peeling prevention layer 131 has transparent ability; and having transparent ability means light transmittance of Al$_2$O$_3$ is greater than or equal to 90%. In this embodiment, Al$_2$O$_3$ is completely transparent. Because the Al$_2$O$_3$ in the peeling prevention layer 131 has high transparent ability, the peeling prevention layer 131 can completely cover the surface of the substrate 11, thereby reducing the patterning processes.

Figure 3:
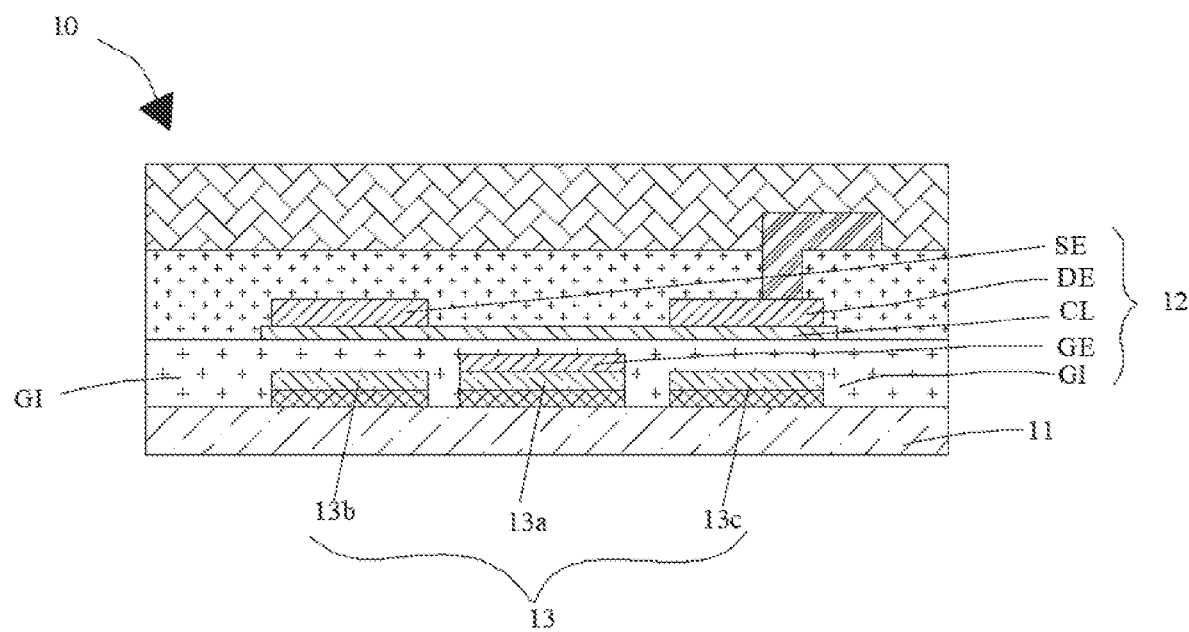
FIG. 3 is a schematic diagram of another structure of the array substrate provided by the present application.

Please refer to FIG. 3. FIG. 3 is a schematic diagram of another structure of the array substrate 10 provided by the present application.

The difference between the array substrate 10 of this embodiment and the array substrate 10 in FIG. 1 is that:

the first anti-reflective layer 13 includes a first portion 13a, and a second portion 13b, and a third portion 13c located on two sides of the first portion 13a; wherein the first portion 13a is disposed corresponding to the gate electrode GE, the second portion 13b is disposed corresponding to the source electrode SE, and the third portion 13c is disposed corresponding to the drain electrode DE; the first portion 13a has a shape same as the gate electrode GE; the second portion 13b has a shape same as the source electrode SE; and the third part 13c has a shape same as the drain electrode DE.

It can be understood that in other embodiments, an orthogonal projection of the first portion 13a on a plane where the substrate 11 is located can further partially cover or completely cover an orthogonal projection of the gate electrode GE on the plane where the substrate 11 is located. An orthogonal projection of the second portion 13b on the plane where the substrate 11 is located can further partially cover or completely cover an orthogonal projection of the source electrode SE on the plane where the substrate 11 is located. An orthogonal projection of the third portion 13b on the plane where the substrate 11 is located can further partially cover or completely cover an orthogonal projection of the drain electrode DE on the plane where the substrate 11 is located.

Figure 4:
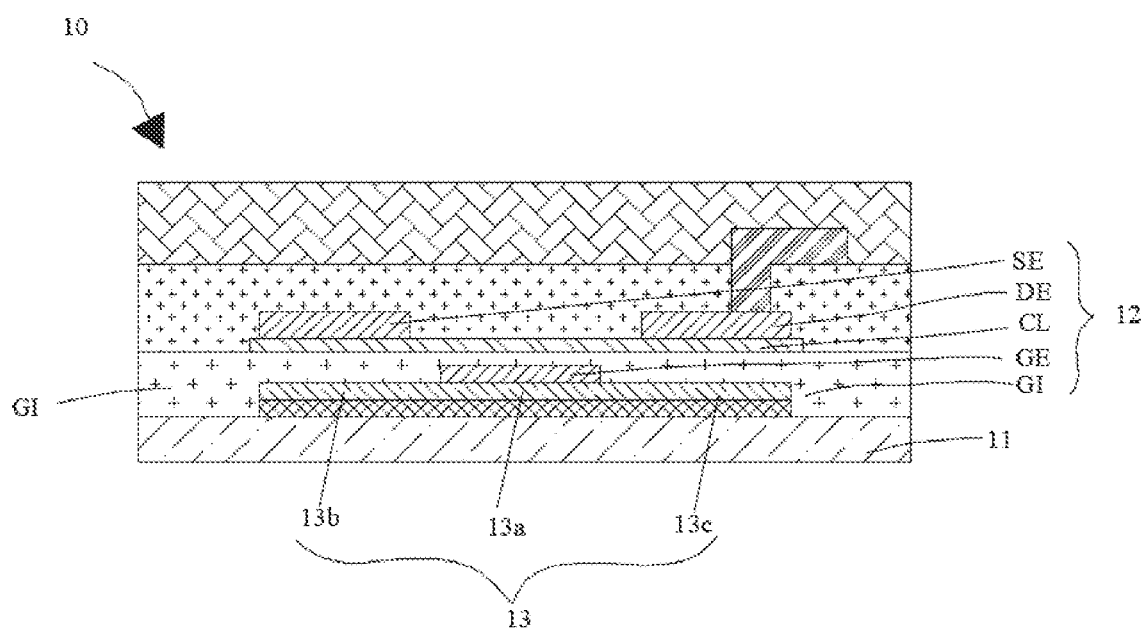
FIG. 4 is a schematic diagram of another structure of the array substrate provided by the present application.
Figure 5:
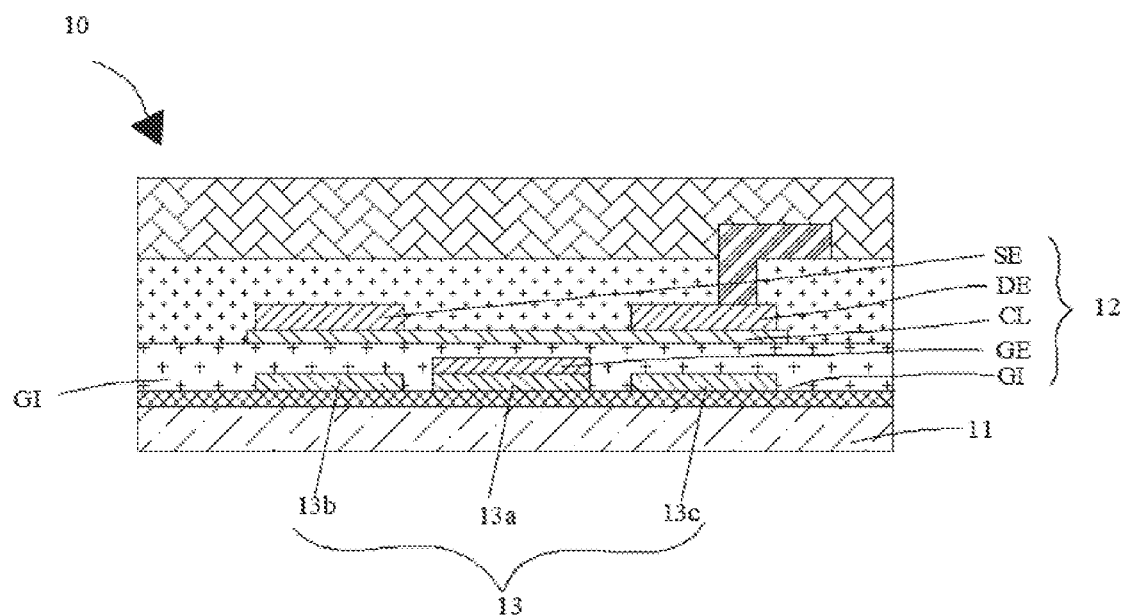
FIG. 5 is a schematic diagram of another structure of the array substrate provided by the present application.

In this embodiment, the first portion 13a, the second portion 13b, and the third portion 13c are disposed spaced apart from each other. In another embodiment, please refer to FIG. 4. The first portion 13a, the second portion 13b, and the third portion 13c can also be connected to each other to form in one piece. In another embodiment, also as illustrated in FIG. 5, the first portion 13a, the second portion 13b, and the third portion 13c of the peeling prevention layer 131 form one piece and covers the first surface 11a.

Figure 6:
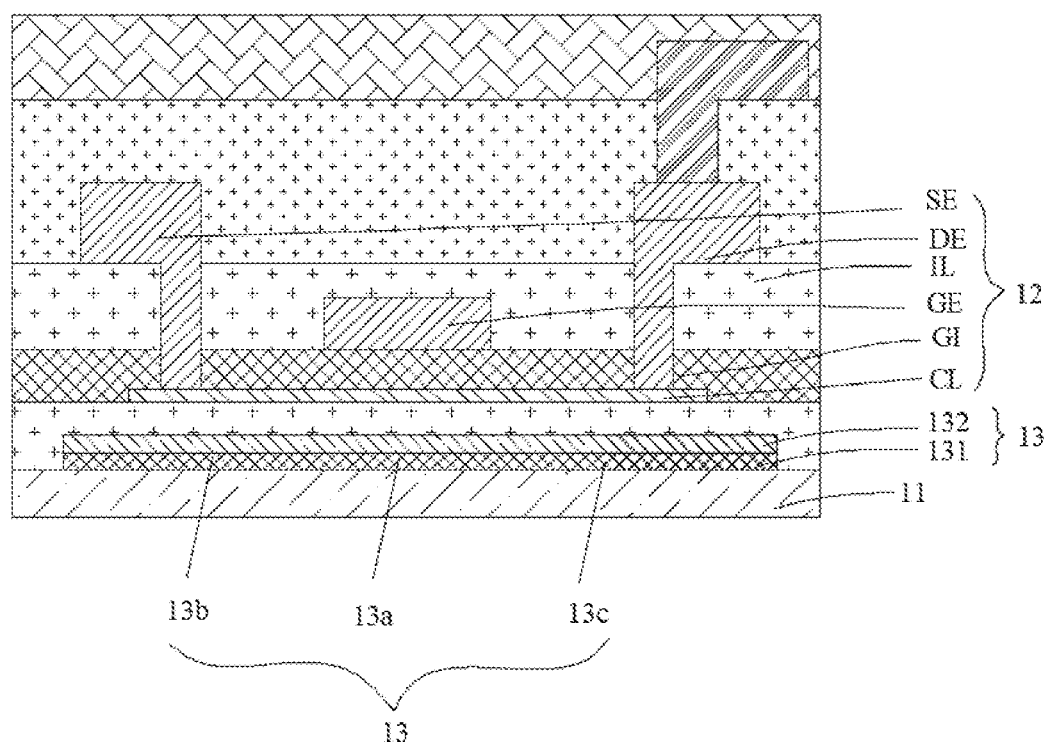
FIG. 6 is a schematic diagram of another structure of the array substrate provided by the present application.

Please refer to FIG. 6. FIG. 6 is a schematic diagram of another structure of the array substrate 10 provided by the present application. In this embodiment, the thin film transistor layer 12 is a top-gate type thin film transistor. Specifically, the thin film transistor layer 12 includes an active layer CL, a gate insulation layer GI, a gate electrode GE, an interlayer insulation layer IL, a source electrode SE, and a drain electrode DE sequentially disposed on the substrate 11. Specifically, the active layer CL is located on a first surface 11a of the substrate 11. The gate insulation layer GI covers the active layer CL. The gate electrode GE is located on a side of the gate insulation layer GI away from the substrate 11. The gate electrode GE is disposed corresponding to the active layer CL. The interlayer insulation layer IL covers the gate electrode GE. The source electrode SE and the drain electrode DE are located on a side of the interlayer insulation layer IL away from the gate electrode GE and are connected to two ends of the active layer CL through a via hole defined in the interlayer insulation layer IL.

Materials of the gate electrode GE, the source electrode SE, and the drain electrode DE can be a single-layer metal of copper, tantalum, tungsten, molybdenum, aluminum (Al), titanium etc., or can be multi-layer metals. For example, a double-layer metal of molybdenum/tantalum, a double-layer metal of molybdenum/tungsten, a three-layer metal of molybdenum/aluminum/molybdenum, etc., can be used.

A material of the active layer CL can be monocrystalline silicon, low-temperature polycrystalline-silicon, or oxide semiconductor materials. The oxide semiconductor materials can include indium gallium zinc oxide, indium gallium zinc tin oxide, indium zinc oxide (IZO), indium gallium oxide, indium gallium tin oxide, indium zinc tin oxide, and indium tin oxide, etc.

A material of the gate insulation layer GI can be one selected from the group consisting of silicon dioxide, nitrogen dioxide, and a laminated layer thereof.

Figure 7:
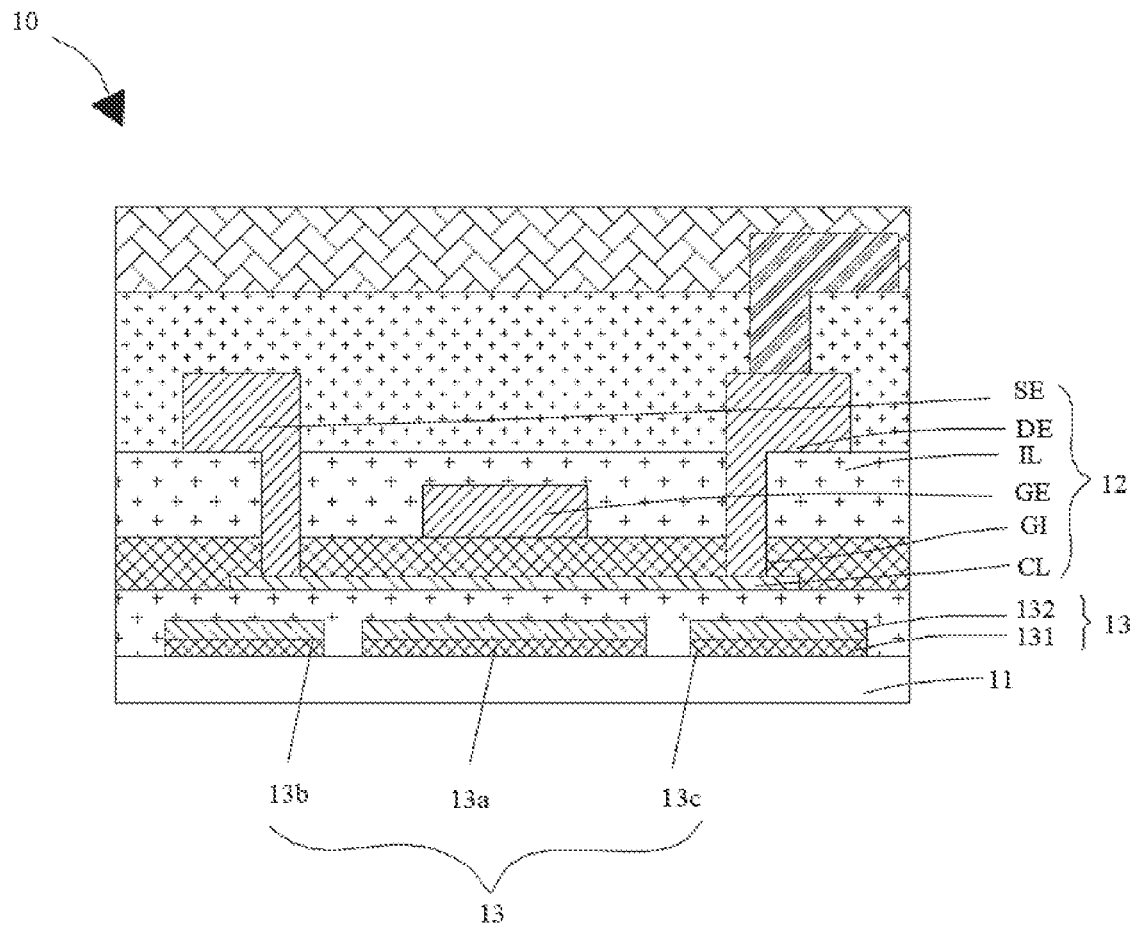
FIG. 7 is a schematic diagram of another structure of the array substrate provided by the present application.

The first anti-reflective layer 13 is located between the substrate 11 and the thin film transistor layer 12. Specifically, the first anti-reflective layer 13 is located between the substrate 11 and the active layer CL. It can be understood that an insulation layer can be disposed between the first anti-reflective layer 13 and the active layer CL. Specifically, the first anti-reflective layer 13 includes a first portion 13a, and a second portion 13b and a third portion 13c located on two sides of the first portion 13a. Wherein, the first portion 13a is disposed corresponding to the gate electrode GE, the second portion 13b is disposed corresponding to the source electrode SE, and the third portion 13c is disposed corresponding to the drain electrode DE. In this embodiment, the first portion 13a, the second portion 13b, and the third portion 13c are connected to each other to from in one piece. Please refer to FIG. 7, in another embodiment, the first portion 13a, the second portion 13b, and the third portion 13c are disposed spaced apart from each other. Because the active layer CL faces toward an audience side and is directly illuminated by ambient light, the active layer CL is easily affected by light. The second portion 13b can further act as a light shielding layer of the active layer CL to prevent the active layer CL from influence of illumination and affecting display effect.

Figure 8:
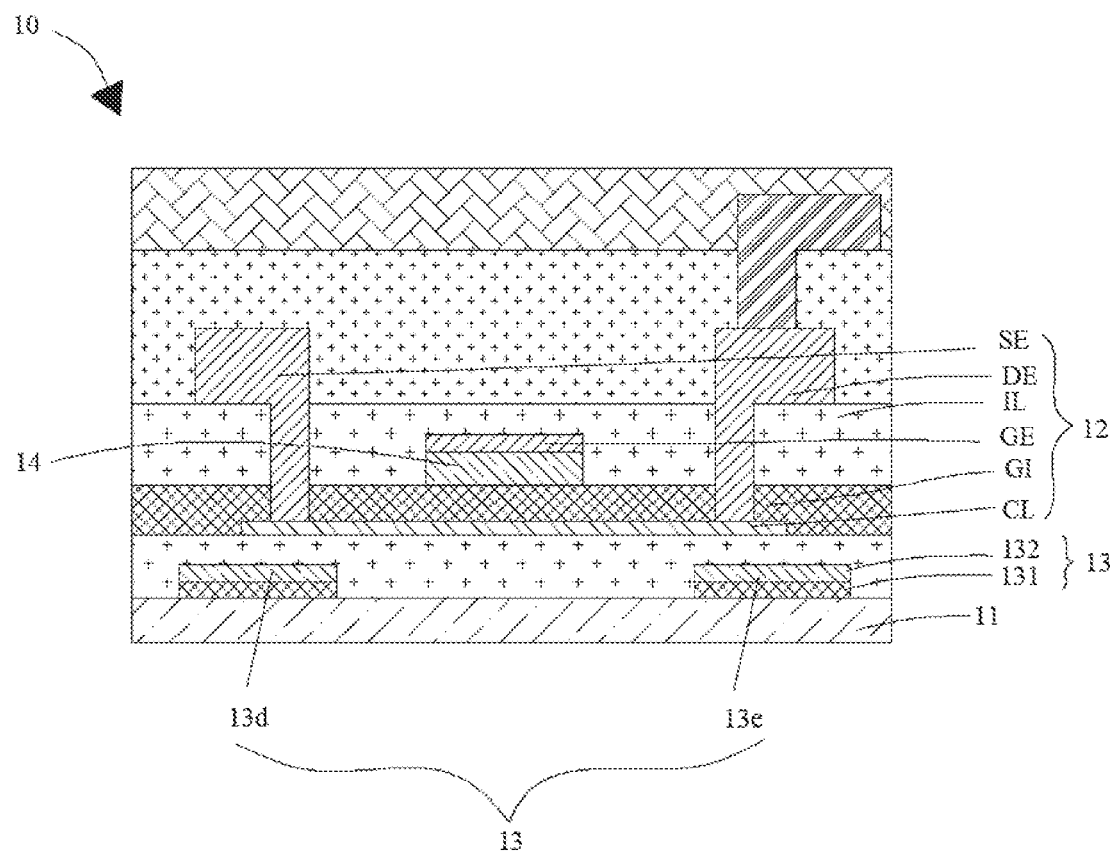
FIG. 8 is a schematic diagram of another structure of the array substrate provided by the present application.

Please refer to FIG. 8. FIG. 8 is a schematic diagram of another structure of the array substrate 10 provided by the present application.

The difference between the array substrate 10 of this embodiment and the array substrate 10 in FIG. 6 is that:

the first anti-reflective layer 13 includes a fourth portion 13d and a fifth portion 13e, the fourth portion 13d is disposed corresponding to the source electrode SE, and the fifth portion 13e is disposed corresponding to the drain electrode DE. In this embodiment, a second anti-reflective layer 14 can be disposed on a surface of the gate electrode GE facing toward the substrate 11. A material of the second anti-reflective layer 14 can be MoOx or an alloy of MoOx. The second anti-reflective layer 14 is configured to reflect incident light at the gate electrode GE. It can be understood that in order to prevent the active layer CL from being affected by light, a light shielding layer can also be disposed between the fourth portion 13d and the fifth portion 13e to shield light for the active layer CL.

An array substrate includes: a substrate, wherein the substrate includes a first surface and a second surface disposed opposite to each other; a thin film transistor layer disposed on the first surface, wherein the thin film transistor layer includes a gate electrode, a source electrode, and a drain electrode, the gate electrode is disposed on the first surface, and the source electrode and the drain electrode are located on a side of the gate electrode away from the substrate; and a first anti-reflective layer disposed between the substrate and the thin film transistor layer and disposed corresponding to at least one of the gate electrode, the source electrode, or the drain electrode, wherein, the first anti-reflective layer comprises a peeling prevention layer and an anti-reflective functional layer, the peeling prevention layer is disposed on the first surface, and the anti-reflective functional layer is disposed on a side of the peeling prevention layer away from the substrate. In the present application, by disposing the peeling prevention layer between the anti-reflective functional layer and the substrate of the array substrate, peeling between the thin film transistor and the substrate can be prevented.

Figure 9:
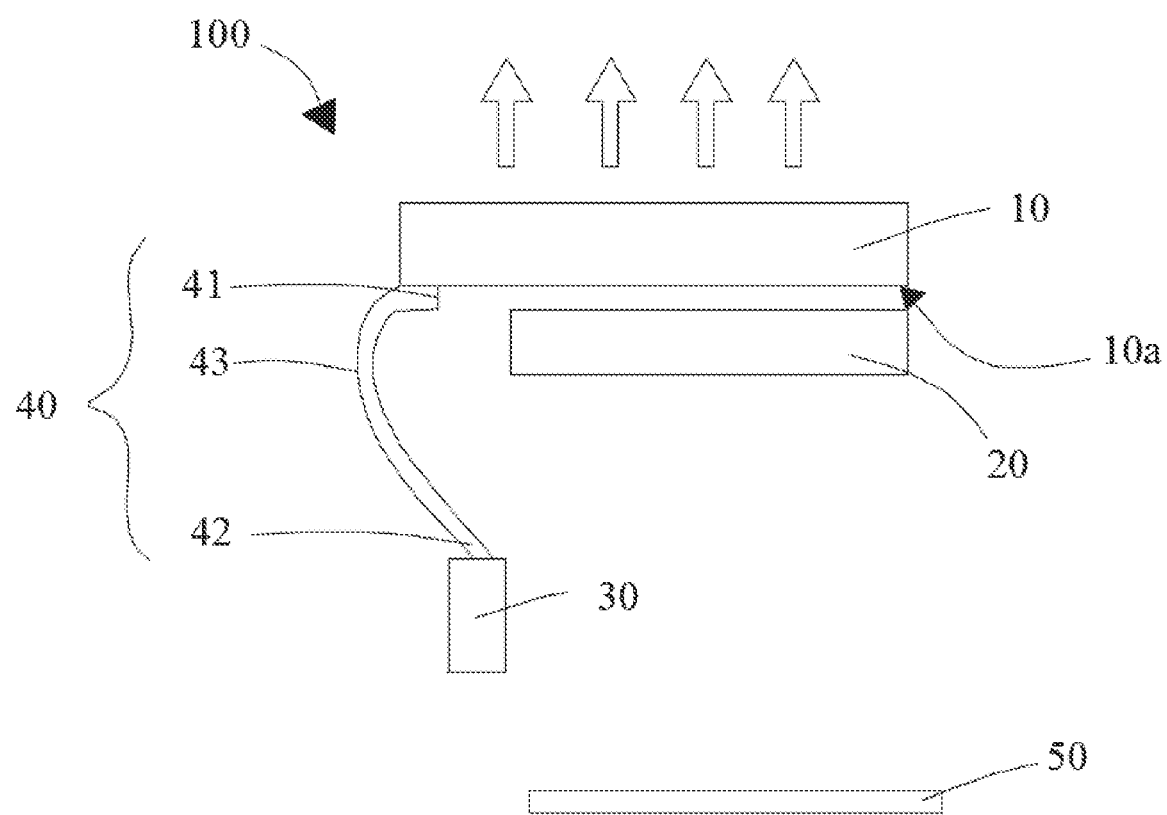
FIG. 9 is a schematic diagram of one structure of a display device provided by the present application.

Please refer to FIG. 9, the present application further provides a display device 100. The display device 100 can be a smart phone, a tablet personal computer, a mobile phone, a video phone, an e-book reader, a desktop PC, a laptop, a netbook computer, a workstation, a server, a personal digital assistant, a portable multimedia player, an MP3 player, a mobile medical machine, a camera, a game console, a digital camera, a car navigation system, an electronic billboard, an automated teller machine, or a wearable device, and the present application is not limited thereto.

In one embodiment of the present application, the display device 100 includes an array substrate 10, a color film substrate 20, a driving component 30, a flexible connection component 40, and a backlight source 50.

The array substrate 10 is the array substrate described in each aforesaid embodiment, and redundant description will not be mentioned herein.

The color film substrate 20 is disposed opposite to the array substrate 10.

The driving component 30 is disposed on a side of the color film substrate 20 facing toward the color film substrate 20. In one embodiment, the driving component 30 can be a printed circuit board.

The flexible connection component 40 is electrically connected to the array substrate 10 and the driving component 30. Specifically, the flexible connection component 40 includes a first terminal 41, a second terminal 42, and a bending portion 43. The bending portion 43 is connected between the first terminal 41 and the second terminal 42. The first terminal 41 is electrically connected to a non-display surface 10*a* of the array substrate 10. The second terminal 42 is electrically connected to the driving component 30. In one embodiment, the flexible connection component 40 includes a chip on film (COF) and a flexible circuit board (FPC).

The backlight source 50 is disposed on a side of the color film substrate 20 away from the array substrate 10.

The aforesaid array substrate is used in the display device provided by the present application. By disposing the peeling prevention layer between the anti-reflective functional layer and the substrate of the array substrate, peeling between the thin film transistor and the substrate can be prevented, thereby reducing the reflectivity and improving display effect.

In the display device 100, by disposing the flexible connection component 40 on the non-display surface 10*a* of the array substrate 10, the flexible connecting component 40 is bent less and receives less bending stress, which can improve reliability of a display module and can narrow a bezel, achieving an effect of a narrow bezel or even no bezel.

Although a liquid crystal display device is used as an example to describe the display device in this embodiment, a type of the display device 100 is not limited in the present application. For example, it can be an active light emitting display device, such as an organic light emitting diode (OLED) display device, an active matrix organic light emitting diode (AMOLED) display device, a passive matrix organic light emitting diode (PMOLED) display device, a quantum dot light emitting diode (QLED) display device, a micro light emitting diode (micro-LED) display device, or a mini light emitting diode (mini-LED) display device, etc.

It can be understood that according to the display type of the display device 100, the display device 100 can also include other components used for display.

Figure 10:
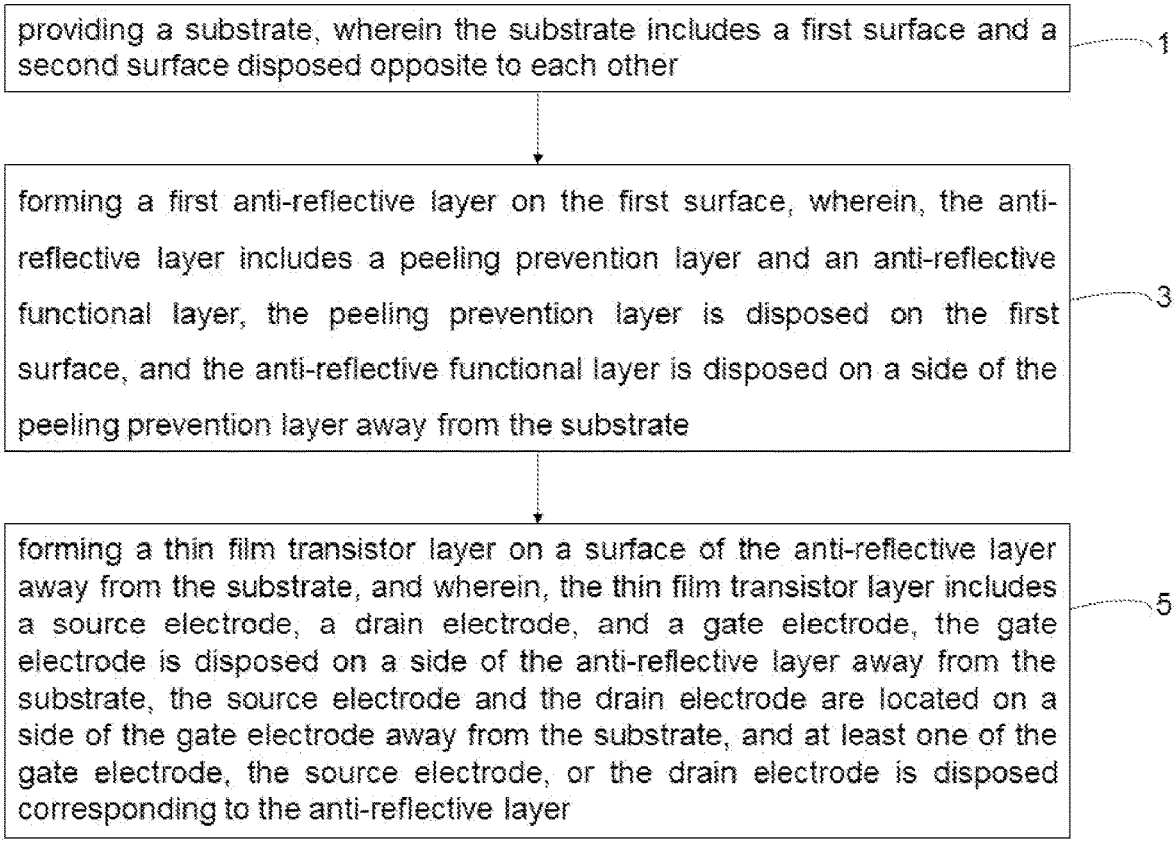
FIG. 10 is a flowchart of one embodiment of a manufacturing method of the array substrate provided by the present application.

Please refer to FIG. 10. The present application further provides a manufacturing method of an array substrate, including following steps.

1. Providing a substrate, wherein the substrate includes a first surface and a second surface disposed opposite to each other.

In one embodiment, the substrate 11 is the glass substrate. In one embodiment, the substrate 11 is a flexible substrate. The flexible substrate can be composed of a single flexible organic layer, or can be composed of two or more flexible organic layers. It should be noted that the first surface 11*a* can be an upper surface of the substrate 11, and the second surface 11*b* can be a lower surface of the substrate 11. Of course, the first surface 11*a* can also be the lower surface of the substrate 11, and the second surface 11*b* can be the upper surface of the substrate 11. In this application, without specific instructions, as default, the first surface 11*a* is the lower surface of the substrate 11 and the second surface 11*b* is the upper surface of the substrate 11.

3: Forming a first anti-reflective layer on the first surface, wherein, the anti-reflective layer includes a peeling prevention layer and an anti-reflective functional layer, the peeling prevention layer is disposed on the first surface, and the anti-reflective functional layer is disposed on a side of the peeling prevention layer away from the substrate.

In one embodiment, a material of the anti-reflective functional layer includes molybdenum oxide, and a material of the peeling prevention layer includes aluminum oxide.

In one embodiment, the step 3 includes:
31: forming a first material layer on the first surface, and
32: forming a second material layer on a surface of the first material layer away from the substrate.

The first material layer includes $Al_2O_3$. A material of the second material layer includes molybdenum oxide. Specifically, a material of the second material layer can be molybdenum oxide or an alloy of molybdenum oxide. The molybdenum oxide alloy is to add other metal elements, such as Ti, Ta, or W, etc., in the molybdenum oxide. The molybdenum oxide can include $MoO_x$ and/or $MoO_x$-a, wherein x can be 2 or 3, and a can be 0 or 1.

In one embodiment, a material of the second material layer includes $MoO_x$, and wherein x is 2 or 3.

Compared to a single layer of the molybdenum oxide, aluminum oxide-molybdenum oxide composite film layers can improve adhesion of the first anti-reflective layer 13 to the substrate 11. In addition, an Al—Mo metal bond can also be formed between the anti-reflective functional layer 132 and the peeling prevention layer 131. Existence of the Al—Mo metal bond can further increase bonding force between the aluminum oxide-molybdenum oxide composite film layers.

In one specific embodiment, the molybdenum oxide includes molybdenum dioxide. The first anti-reflective layer 13 is formed by directly depositing a material of the molybdenum dioxide on the aluminium oxide. In one specific embodiment, the molybdenum oxide includes molybdenum trioxide. The first anti-reflective layer 13 is formed by directly depositing a material of the molybdenum trioxide on the aluminium oxide. In another specific embodiment, molybdenum dioxide is deposited on the aluminum film, and aluminum atoms in the aluminum film are combined with the oxygen in the molybdenum dioxide to form aluminum oxide, which is the peeling prevention layer 131, and then the molybdenum dioxide becomes molybdenum monoxide, which is the anti-reflective functional layer 132. Therefore, the first anti-reflective layer 13 is obtained. According to a progress of the reaction, there is molybdenum dioxide that did not participate in the reaction in the anti-reflective functional layer 132. At this time, the anti-reflective functional layer 132 includes molybdenum monoxide and molybdenum dioxide. In another specific embodiment, molybdenum trioxide is deposited on the aluminum film, and aluminum atoms in the aluminum film are combined with the oxygen in the molybdenum dioxide to form aluminum oxide, which is the peeling prevention layer 131, and then the molybdenum trioxide becomes molybdenum monoxide and/or molybdenum dioxide, which is the anti-reflective functional layer 132. Therefore, the first anti-reflective layer 13 is obtained. According to a progress of the reaction, there is molybdenum trioxide that did not participate in the reaction in the anti-reflective functional layer 132. At this time, the anti-reflective functional layer 132 includes molybdenum monoxide, molybdenum dioxide, and molybdenum trioxide. It can be understood that in another specific embodiment, the molybdenum dioxide and molybdenum trioxide can also be deposited on the aluminum film, and aluminum atoms in the aluminum film combine with the oxygen in the molybdenum dioxide to form aluminum oxide, which is the peeling prevention layer 131, and then the molybdenum dioxide and the molybdenum trioxide becomes molybdenum monoxide and the molybdenum dioxide, which are the anti-reflective functional layer 132. Therefore, the first anti-reflective layer 13 is obtained. In another embodiment, the step 3 includes:

33: forming the first material layer on the first surface, and a material of the first material layer is aluminum;

34: forming the second material layer on a surface of the first material layer away from the substrate, wherein a material of the second material layer includes MoOx, and wherein x is 2 or 3; and 35: making a reaction occur in the first material layer and the second material layer, wherein the aluminum in the first material layer captures oxide in a first molybdenum oxide layer to form a peeling prevention layer, a material of the peeling prevention layer includes aluminum oxide, the second material layer forms an anti-reflective functional layer, a material of the anti-reflective functional layer includes MoOx-a, wherein x is 2 or 3, a is 0 or 1, and the peeling prevention layer and the anti-reflective functional layer form the first anti-reflective layer. It can be understood that the material of the anti-reflective functional layer can further include unreacted MoOx according to the reaction process.

Specifically, making the reaction occur in the first material layer and the second material layer includes:

performing a high-temperature process on the substrate formed with the first material layer and the second material layer under vacuum to make the reaction occur in the first material layer and the second material layer. A temperature of the high-temperature process is greater than or equal to 200° C. In one embodiment, the temperature of the vacuum high-temperature process ranges from 200° C. to 400° C.

Under the high temperature, a part of oxygen ions in the MoOx combines with Al to form $Al_2O_3$, thereby forming strong Al—O bonds.

A thickness of the aluminum film is not limited by the present application. In one embodiment, the thickness of the aluminum film ranges from 10 angstroms to 100 angstroms. In one embodiment, a thickness of the peeling prevention layer 131 can be 10 angstroms, 20 angstroms, 30 angstroms, 40 angstroms, 50 angstroms, 60 angstroms, 70 angstroms, 80 angstroms, 90 angstroms, or 100 angstroms. In this embodiment, a thickness of the used aluminum film is relatively thin. The thin aluminum film can be etched by fluorine-containing hydrogen peroxide copper acid in subsequent manufacturing processes, thereby reducing difficulty the processes. For aluminum films with the thickness of 10 angstroms to 100 angstroms, the vacuum high temperature treatment time is 1 minute to 200 minutes. The thicker the aluminum film is, the longer the high-temperature treatment time is, and it is not limited specifically. With extension of the high-temperature treatment time, the aluminum film with the thickness of 10 angstroms to 100 angstroms can be completely transformed into a transparent $Al_2O_3$ film, and wherein having transparent ability means light transmittance of $Al_2O_3$ is greater than or equal to 90%. In one embodiment, $Al_2O_3$ is completely transparent.

In one embodiment, a refractive index of the substrate 11 is less than a refractive index of the peeling prevention layer 131, and the refractive index of the peeling prevention layer 131 is less than a refractive index of the anti-reflective functional layer 132. When light enters another medium with a refractive index of n1 from a medium with a refractive index of n0, light reflection occurs at an interface between the two media. When the reflectivity of the two media satisfies n0<n1, destructive interference occurs on reflected light, reducing reflectivity. By setting the refractive index of the substrate 11 to be smaller than the refractive index of the peeling prevention layer 131, and by setting the refractive index of the peeling prevention layer 131 to be smaller than the refractive index of the anti-reflective functional layer 132, a refractive index of the array substrate 10 to ambient light can be further reduced, and the display effect can be improved.

In one specific embodiment, the glass substrate is used as the substrate 11. The refractive index of the substrate 11, the refractive index of the peeling prevention layer 131, and the refractive index of the anti-reflective functional layer 132 are sequentially 1.50, 1.65, and 2.20. Light is incident from the glass substrate. During a propagation of the light in the substrate 11, the peeling prevention layer 131, and the anti-reflective functional layer 132, many interference effects are generated, so the reflectivity is reduced.

Under a condition that Cu is used as a material of the gate electrode GE, and the film thicknesses of the glass substrate, the anti-reflective functional layer 132, and the gate electrode GE are unchanged, through experiments for testing the reflectivities of the composite films, the reflectivity of the aluminum-oxide molybdenum-oxide copper composite film is 4.5%, and the reflectivity of the molybdenum-oxide copper composite film is 5.8%. Experimental data confirms that reflectivity of the composite film with $Al_2O_3$ is lower.

In one embodiment, besides the aforesaid step, the step 3 further includes a step 36: patterning the first material layer and the second material layer. Specifically, the patterning step is performed by etching the first material layer and the second material layer by fluorine-containing hydrogen peroxide copper acid.

In one embodiment, besides the aforesaid step, the step 3 further includes a step 37: Specifically, the patterning step is performed by etching the second material layer by the fluorine-containing hydrogen peroxide copper acid. The second material layer is patterned. Because the $Al_2O_3$ film is transparent, etching can be only performed on the second material layer.

5: Forming a thin film transistor layer on a surface of the anti-reflective layer away from the substrate, and wherein, the thin film transistor layer includes a source electrode, a drain electrode, and a gate electrode, the gate electrode is disposed on a side of the anti-reflective layer away from the substrate, the source electrode and the drain electrode are located on a side of the gate electrode away from the substrate, and at least one of the gate electrode, the source electrode, or the drain electrode is disposed corresponding to the anti-reflective layer.

The structure of the thin film transistor can refer to the description about the aforesaid array substrate 10, and redundant description will not be mentioned herein again.

In one embodiment, the step 5 includes:

51: depositing a gate metal layer on a side of the second material layer away from the first material layer;

52: patterning the gate electrode metal layer to form the gate electrode; and

53: forming a gate insulation layer, an active layer, an interlayer insulation layer, a source electrode, and a drain electrode on a surface of the gate electrode metal layer away from the substrate to obtain the thin film transistor layer. Wherein, the active layer is disposed corresponding to the gate electrode, the source electrode and the drain electrode are located on a surface of the active layer away from the gate electrode and are respectively connected to two ends of the active layer. At least one of the gate electrode, the source electrode, or the drain electrode is disposed corresponding to the anti-reflective layer. In this embodiment, the step 52, the step 36 or the step 37 can be performed in one same process.

In one embodiment, the step 5 includes:

forming the gate electrode on a surface of the first anti-reflective layer away from the substrate, and
  depositing the gate insulation layer on the gate electrode;
  forming the active layer on the gate insulation layer;
  forming the interlayer insulation layer on the active layer; and
  forming the source electrode and the drain electrode on the interlayer insulation layer. Wherein, depositing the gate insulation layer on the gate electrode, depositing the gate insulation layer on the side of the first material layer away from the substrate, and performing the high-temperature process under vacuum the substrate where the first material layer and the second material layer are formed are performed in one same process. By combining the middle step of processing the substrate in the high temperature to the step of depositing the gate insulation layer, the high temperature of the process of depositing the gate insulation layer can be used to make Al capture the oxygen ions in MoOx to form $Al_2O_3$, thereby reducing the process.

Figure 11:
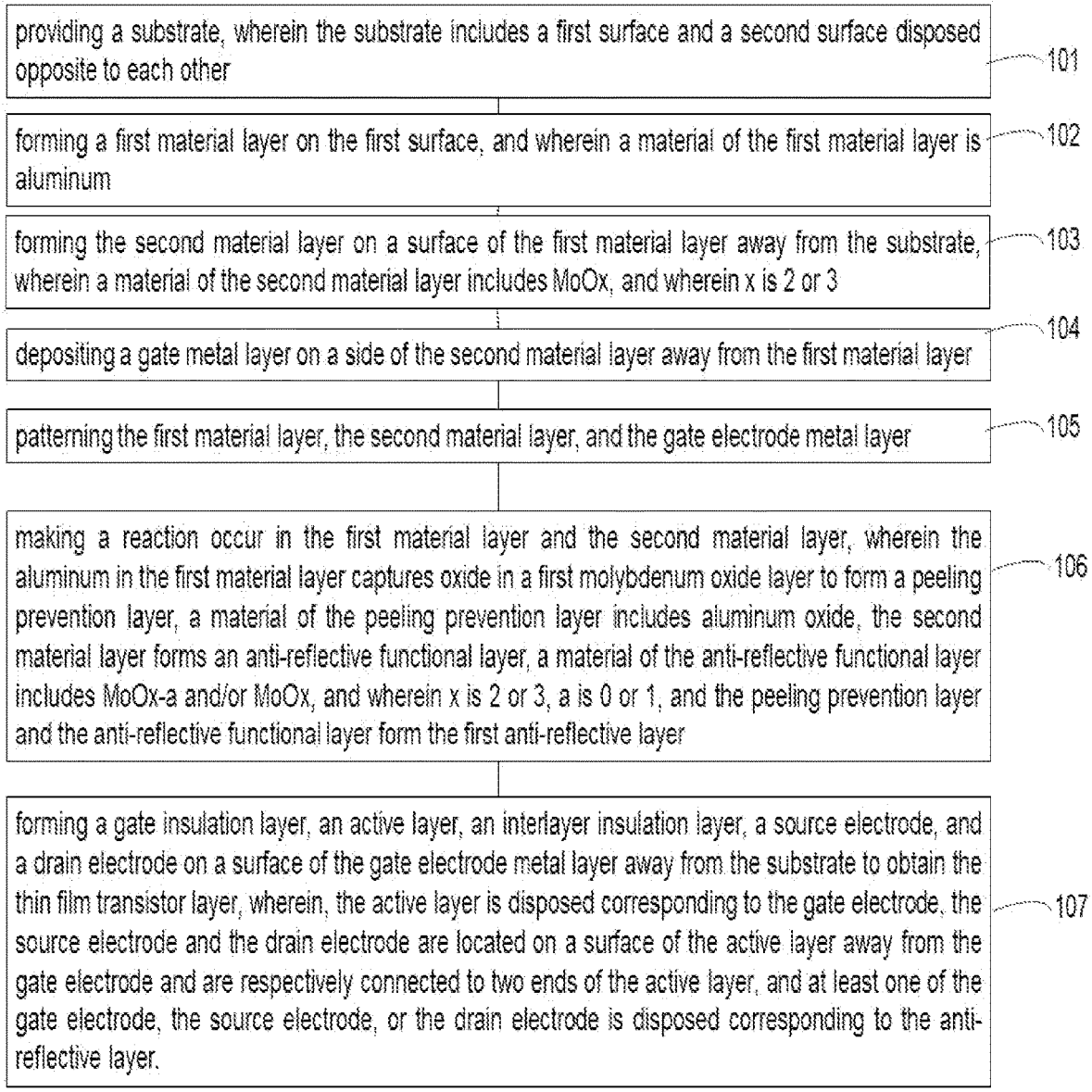
FIG. 11 is a flowchart of another embodiment of the manufacturing method of the array substrate provided by the present application.

It can be understood that the order of the steps in the aforesaid method is only for description, and the steps of the method provided in the present application are not limited to the order specifically described above, unless they are specifically described in other method. Please refer to FIG. 11, one specific embodiment of the manufacturing method of the array substrate of the present application is described as follow. The manufacturing method of the array substrate includes the following steps.

101: Providing a substrate, wherein the substrate includes a first surface and a second surface disposed opposite to each other.

102: Forming a first material layer on the first surface, and wherein a material of the first material layer is aluminum.

103: Forming the second material layer on a surface of the first material layer away from the substrate, wherein a material of the second material layer includes MoOx, and wherein x is 2 or 3.

104: Depositing a gate metal layer on a side of the second material layer away from the first material layer.

105: Patterning the first material layer, the second material layer, and the gate electrode metal layer.

106: Making a reaction occur in the first material layer and the second material layer, wherein the aluminum in the first material layer captures oxide in a first molybdenum oxide layer to form a peeling prevention layer, a material of the peeling prevention layer includes aluminum oxide, the second material layer forms an anti-reflective functional layer, a material of the anti-reflective functional layer includes MoOx-a and/or MoOx, and wherein x is 2 or 3, and a is 0 or 1, and the peeling prevention layer and the anti-reflective functional layer form the first anti-reflective layer. A reaction condition of making the reaction occur in the first material layer and the second material layer is performing a high-temperature process on the substrate where the first material layer and the second material layer are formed under vacuum, wherein the temperature of the high-temperature process is greater than or equal to 200° C. It can be understood that the material of the anti-reflective functional layer can further include unreacted MoOx according to the reaction process.

107: Forming a gate insulation layer, an active layer, an interlayer insulation layer, a source electrode, and a drain electrode on a surface of the gate electrode metal layer away from the substrate to obtain the thin film transistor layer, wherein, the active layer is disposed corresponding to the gate electrode, the source electrode and the drain electrode are located on a surface of the active layer away from the gate electrode and are respectively connected to two ends of the active layer, and at least one of the gate electrode, the source electrode, or the drain electrode is disposed corresponding to the anti-reflective layer.

It can be understood that the order of the steps used in the method is only for description, and the steps of the method provided in the present application are not limited to the order specifically described above, unless they are specifically described in other method.

In the manufacturing method of the array substrate provided by the present application, by forming the peeling prevention layer between the anti-reflective functional layer and the substrate of the array substrate, peeling between the thin film transistor and the substrate in the array substrate can be prevented, thereby reducing the reflectivity and improving display effect.

In one embodiment, by forming the $Al_2O_3$ film layer under the MoOx film layer, the $Al_2O_3$/MoOx composite film layer is formed in the manufacturing method of the array substrate provided by the present application, which can improve adhesion between the composite film layer and the substrate. In addition, by configuring the refractive indexes of the substrate, the peeling prevention layer, and the anti-reflective functional layer, the reflectivity index of the composite film layer can be further reduced. Furthermore, by using the manufactured array substrate in a display product in which a side of the array substrate faces outward, reliability of the product can be improved, reflectivity of the product can be reduced, and user experience is improved.

In addition, in some embodiments, the $Al_2O_3$ film is manufactured by using Al to capture oxygen ions in MoOx, so there is no need to use expensive $Al_2O_3$ targets, thereby reducing production cost and being suitable for high-generation production lines.

The above provides a detailed description to the embodiments of present application. The principle and implementation manner of present application are described herein with reference to specific embodiments. The foregoing descriptions of the embodiments are merely used for better understanding of the present application. Meanwhile, for a person of ordinary skill in the art can make variations and modifications to the specific implementation manner and application scope according to the idea of this application. In summary, contents of the specification shall not be construed as a limitation to this application.

What is claimed is:

1. An array substrate, comprising:
   a substrate, wherein the substrate comprises a first surface and a second surface disposed opposite to each other;
   a first anti-reflective layer disposed on the first surface, wherein the first anti-reflective layer comprises a peeling prevention layer and an anti-reflective functional layer, the peeling prevention layer is disposed on the first surface, and the anti-reflective functional layer is disposed on a side of the peeling prevention layer away from the substrate;
   a thin film transistor layer, wherein one part of the thin film transistor layer is disposed on a side of the first anti-reflective layer away from the substrate, and the other part of the thin film transistor layer is disposed on the first surface, the thin film transistor layer comprises a gate electrode, a source electrode, a drain electrode, and an active layer, the gate electrode is disposed on the side of the first anti-reflective layer away from the substrate, the active layer is located on a side of the gate electrode away from the first anti-reflective layer, and the source electrode and the drain electrode are located on a side of the active layer away from the gate electrode; wherein the first anti-reflective layer comprises a first portion, the first portion is disposed corresponding to the gate electrode, and the first portion is disposed on a side of the gate electrode close to the substrate, and
   the first anti-reflective layer further comprises a second portion and a third portion located on two sides of the first portion, the second portion is disposed corresponding to the source electrode, and the third portion is disposed corresponding to the drain electrode.

2. The array substrate as claimed in claim 1, wherein a material of the anti-reflective functional layer comprises molybdenum oxide, and a material of the peeling prevention layer comprises aluminum oxide.

3. The array substrate as claimed in claim 2, wherein the molybdenum oxide comprises MoOx-a or MoOx, and wherein x is 2 or 3, and a is 0 or 1.

4. The array substrate as claimed in claim 1, wherein a transmittance of the peeling prevention layer is greater than or equal to 90%, and the peeling prevention layer covers the first surface.

5. The array substrate as claimed in claim 1, wherein a refractive index of the substrate is less than a refractive index of the peeling prevention layer, and the refractive index of the peeling prevention layer is less than a refractive index of the anti-reflective functional layer.

6. A manufacturing method of an array substrate, comprising following steps:
   providing a substrate, wherein the substrate comprises a first surface and a second surface disposed opposite to each other;
   forming a first anti-reflective layer on the first surface, wherein the first anti-reflective layer comprises a peeling prevention layer and an anti-reflective functional layer, the peeling prevention layer is disposed on the first surface, and the anti-reflective functional layer is disposed on a surface of the peeling prevention layer away from the substrate; and
   forming a thin film transistor layer on a surface of the first anti-reflective layer away from the substrate and on the first surface, wherein the thin film transistor layer comprises a source electrode, a drain electrode, a gate electrode, and an active layer, the gate electrode is disposed on a side of the first anti-reflective layer away from the substrate, the active layer is located on a side of the gate electrode away from the first anti-reflective layer, and the source electrode and the drain electrode are located on a side of the active layer away from the gate electrode;
   wherein the first anti-reflective layer comprises a first portion, the first portion is disposed corresponding to the gate electrode, and the first portion is disposed on a side of the gate electrode close to the substrate, and
   the first anti-reflective layer further comprises a second portion and a third portion located on two sides of the first portion, the second portion is disposed corresponding to the source electrode, and the third portion is disposed corresponding to the drain electrode.

7. The manufacturing method of the array substrate as claimed in claim 6, wherein forming the first anti-reflective layer on the first surface comprises:
   forming a first material layer on the first surface, wherein a material of the first material layer is aluminum;
   forming a second material layer on a surface of the first material layer away from the substrate, wherein a material of the second material layer comprises MoOx, and wherein x is 2 or 3; and
   making reaction occur in the first material layer and the second material layer, wherein the aluminum in the first material layer captures oxide in the second material layer to form the peeling prevention layer, a material of the peeling prevention layer comprises aluminum oxide, the second material layer forms the anti-reflective functional layer, a material of the anti-reflective functional layer comprises MoOx-a, wherein x is 2 or 3, and a is 0 or 1, and the peeling prevention layer and the anti-reflective functional layer form the first anti-reflective layer.

8. The manufacturing method of the array substrate as claimed in claim 7, wherein making the reaction occur in the first material layer and the second material layer comprises:
   performing a high-temperature process on the substrate where the first material layer and the second material layer are formed under vacuum to make the reaction occur in the first material layer and the second material layer.

9. A display device, comprising:
   an array substrate, comprising:
   a substrate, wherein the substrate comprises a first surface and a second surface disposed opposite to each other;
   a first anti-reflective layer disposed on the first surface, wherein the first anti-reflective layer comprises a peeling prevention layer and an anti-reflective functional layer, the peeling prevention layer is disposed on the first surface, and the anti-reflective functional layer is disposed on a side of the peeling prevention layer away from the substrate;

a thin film transistor layer, wherein one part of the thin film transistor layer is disposed on a side of the first anti-reflective layer away from the substrate, and the other part of the thin film transistor layer is disposed on the first surface, the thin film transistor layer comprises a gate electrode, a source electrode, a drain electrode, and an active layer, the gate electrode is disposed on the side of the first anti-reflective layer away from the substrate, the active layer is located on a side of the gate electrode away from the first anti-reflective layer, and the source electrode and the drain electrode are located on a side of the active layer away from the gate electrode; a color film substrate disposed opposite to the array substrate;

a driving component disposed on a side of the color film substrate facing toward the color film substrate; and a flexible connection component electrically connected to the array substrate and the driving component;

wherein the first anti-reflective layer comprises a first portion, the first portion is disposed corresponding to the gate electrode, and the first portion is disposed on a side of the gate electrode close to the substrate, and the first anti-reflective layer further comprises a second portion and a third portion located on two sides of the first portion, the second portion is disposed corresponding to the source electrode, and the third portion is disposed corresponding to the drain electrode.

10. The display device as claimed in claim 9, wherein a material of the anti-reflective functional layer comprises molybdenum oxide, and a material of the peeling prevention layer comprises aluminum oxide.

11. The display device as claimed in claim 10, wherein the molybdenum oxide comprises MoOx-a or MoOx, and wherein x is 2 or 3, and a is 0 or 1.

12. The display device as claimed in claim 9, wherein a transmittance of the peeling prevention layer is greater than or equal to 90.

13. An array substrate, comprising:

a substrate, wherein the substrate comprises a first surface and a second surface disposed opposite to each other;

a thin film transistor layer disposed on the first surface, wherein the thin film transistor layer comprises a gate electrode, a source electrode, and a drain electrode, the gate electrode is disposed above the first surface, and the source electrode and the drain electrode are located on a side of the gate electrode away from the substrate; and a first anti-reflective layer disposed between the substrate and the thin film transistor layer and disposed corresponding to at least one of the gate electrode, the source electrode, or the drain electrode, wherein the first anti-reflective layer comprises a peeling prevention layer and an anti-reflective functional layer, the peeling prevention layer is disposed on the first surface, and the anti-reflective functional layer is disposed on a side of the peeling prevention layer away from the substrate, the thin film transistor layer further comprises an active layer, the active layer is located on a side of the gate electrode close to the substrate, the first anti-reflective layer comprises a first portion, and a second portion and a third portion located on two sides of the first portion, the first portion is disposed corresponding to the gate electrode, the second portion is disposed corresponding to the source electrode, and the third portion is disposed corresponding to the drain electrode.

14. The array substrate as claimed in claim 13, wherein a material of the anti-reflective functional layer comprises molybdenum oxide, and a material of the peeling prevention layer comprises aluminum oxide.

15. The array substrate as claimed in claim 14, wherein the molybdenum oxide comprises MoOx-a or MoOx, and wherein x is 2 or 3, and a is 0 or 1.

16. The array substrate as claimed in claim 13, wherein a transmittance of the peeling prevention layer is greater than or equal to 90%, and the peeling prevention layer covers the first surface.

17. The array substrate as claimed in claim 13, wherein a refractive index of the substrate is less than a refractive index of the peeling prevention layer, and the refractive index of the peeling prevention layer is less than a refractive index of the anti-reflective functional layer.

18. An array substrate, comprising:

a substrate, wherein the substrate comprises a first surface and a second surface disposed opposite to each other;

a thin film transistor layer disposed on the first surface, wherein the thin film transistor layer comprises a gate electrode, a source electrode, and a drain electrode, the gate electrode is disposed above the first surface, and the source electrode and the drain electrode are located on a side of the gate electrode away from the substrate; and a first anti-reflective layer disposed between the substrate and the thin film transistor layer and disposed corresponding to at least one of the gate electrode, the source electrode, or the drain electrode, wherein the first anti-reflective layer comprises a peeling prevention layer and an anti-reflective functional layer, the peeling prevention layer is disposed on the first surface, and the anti-reflective functional layer is disposed on a side of the peeling prevention layer away from the substrate, the thin film transistor layer further comprises an active layer, the active layer is located on a side of the gate electrode close to the substrate, the first anti-reflective layer comprises a fourth portion and a fifth portion, the fourth portion is disposed corresponding to the source electrode, the fifth portion is disposed corresponding to the drain electrode, and the array substrate further comprises a second anti-reflective layer, and the second anti-reflective layer is disposed corresponding to the gate electrode and is disposed on a side of the gate electrode facing toward the substrate.

19. The array substrate as claimed in claim 18, wherein a material of the anti-reflective functional layer comprises molybdenum oxide, and a material of the peeling prevention layer comprises aluminum oxide.

20. The array substrate as claimed in claim 19, wherein the molybdenum oxide comprises MoOx-a or MoOx, and wherein x is 2 or 3, and a is 0 or 1.

* * * * *